United States Patent
Ramakrishnan et al.

(10) Patent No.: US 9,178,525 B2
(45) Date of Patent: Nov. 3, 2015

(54) MISMATCH CORRECTOR

(71) Applicant: TEXAS INSTRUMENTS INCORPORATED, Dallas, TX (US)

(72) Inventors: Sthanunathan Ramakrishnan, Karnataka (IN); Sreenath Narayanan Potty, Kerala (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/656,122

(22) Filed: Mar. 12, 2015

(65) Prior Publication Data

US 2015/0263749 A1  Sep. 17, 2015

(51) Int. Cl.
 *H03M 1/10* (2006.01)
 *H03M 1/12* (2006.01)
 *H03M 1/06* (2006.01)

(52) U.S. Cl.
 CPC .............. *H03M 1/121* (2013.01); *H03M 1/06* (2013.01); *H03M 1/0626* (2013.01); *H03M 1/1205* (2013.01)

(58) Field of Classification Search
 CPC ....... H03M 1/06; H03M 1/12; H03M 1/1206; H03M 1/121
 USPC ......................................... 341/118, 120, 155
 See application file for complete search history.

(56) References Cited

U.S. PATENT DOCUMENTS

| | | | |
|---|---|---|---|
| 6,522,282 B1* | 2/2003 | Elbornsson | 341/155 |
| 7,084,793 B2* | 8/2006 | Elbornsson | 341/118 |
| 7,283,074 B2* | 10/2007 | Sheng et al. | 341/120 |
| 7,482,956 B2* | 1/2009 | Huang et al. | 341/120 |
| 7,782,235 B1* | 8/2010 | Velazquez | 341/118 |
| 7,916,051 B1 | 3/2011 | Sestok et al. | |
| 7,961,123 B2* | 6/2011 | Nagarajan et al. | 341/118 |
| 8,659,454 B2* | 2/2014 | Sugimoto et al. | 341/118 |
| 8,836,550 B2* | 9/2014 | Snelgrove | 341/118 |
| 8,928,507 B2* | 1/2015 | Taluja et al. | 341/118 |

OTHER PUBLICATIONS

Behzad Razavi, "Problem of Timing Mismatch in Interleaved ADCs", Publisher IEEE, Sep. 2012, pp. 1-8.

* cited by examiner

*Primary Examiner* — Khai M Nguyen
(74) *Attorney, Agent, or Firm* — Charlie A. Brill; Frank D. Cimino

(57) ABSTRACT

A mismatch corrector can include a correction path comprising a plurality of parallel branches that each includes a correction filter that applies a respective one of a plurality of time domain filter coefficients that corresponds to a function of a mismatch profile of an interleaved analog-to-digital (IADC) signal on the IADC signal. The mismatch corrector can also include a delay path that delays the IADC signal by a predetermined number of samples to provide a delayed version of the IADC signal. The mismatch corrector can further include a summer to subtract an output of each correction filter from the delayed version of the IADC signal to generate a corrected IADC signal.

22 Claims, 8 Drawing Sheets

MISMATCH CORRECTOR

CROSS REFERENCE TO RELATED APPLICATIONS

This application claims the benefit of priority to the Indian (IN) Patent Application entitled: "NOVEL TIME DOMAIN CORRECTOR FOR CORRECTING INTERLEAVING MISMATCHES IN AN INTERLEAVED ADC", Application No.: 1298/CHE/2014, filed on 12 Mar. 2014, which is incorporated herein by reference. Additionally, this application is related to the following commonly assigned co-pending U.S. patent applications entitled: "MISMATCH PROFILE", Ser. No. 14/656,205 and "CLOSE-IN TONES", Ser. No. 14/656, 025; all of which are filed contemporaneously herewith and are incorporated herein by reference.

TECHNICAL FIELD

This disclosure relates to systems and methods for implementing a mismatch corrector. More particularly, the mismatch corrector can apply correction filters on an interleaved analog-to-digital converter signal.

BACKGROUND

An analog-to-digital converter (ADC, A/D, or A to D) is a device that converts a continuous physical quantity (e.g., voltage) into a digital number that represents the quantity's amplitude. The analog-to-digital conversion involves quantization of the input, such that a small amount of error is introduced. Moreover, instead of doing a single conversion, an ADC often performs the conversions ("samples" the input) periodically. The result is a sequence of digital values that have been converted from a continuous-time and continuous-amplitude analog signal to a discrete-time and discrete-amplitude digital signal.

A time-interleaved ADC uses N parallel ADCs where each ADC samples data every Nth cycle of the effective sample clock, where N is a positive integer greater than one. The result is that the sample rate is increased N times compared to what each individual ADC can manage.

SUMMARY

Systems and methods are described for implementing a mismatch corrector. More particularly, the mismatch corrector can apply correction filters on an interleaved analog-to-digital converter signal.

One example relates to a mismatch corrector that can include a correction path comprising a plurality of parallel branches that each includes a correction filter that applies a respective one of a plurality of time domain filter coefficients that corresponds to a function of a mismatch profile of an interleaved analog-to-digital (IADC) signal on the IADC signal. The mismatch corrector can also include a delay path that delays the IADC signal by a predetermined number of samples to provide a delayed version of the IADC signal. The mismatch corrector can further include a summer to subtract an output of each correction filter from the delayed version of the IADC signal to generate a corrected IADC signal.

Another example relates to an integrated circuit (IC) chip. The IC chip can include an interleaved analog-to-digital converter (ADC) that includes M number of component ADCs that are each configured to sample an analog signal in response to a clock pulse, wherein M is an integer greater than or equal to two. The interleaved ADC outputs an interleaved ADC (IADC) signal that comprises a plurality of spurious signals formed from mismatches between the M number of component ADCs. The IC chip can also include a mismatch estimator determines a frequency domain mismatch profile estimate that characterizes the mismatches between the M number of component ADCs. The IC chip can further include a time domain converter to convert the frequency domain mismatch profile estimate into M−1 number of filter coefficients in the time domain. The IC chip can still further include a mismatch corrector including M−1 number of correction filters to remove the mismatches from a delayed version of the IADC signal based on the M−1 number of filter coefficients to form a corrected IADC signal.

Yet another example relates to a method that can include receiving an interleaved analog-to-digital (IADC) signal. The IADC signal can include a plurality of image signals caused by mismatches in an interleaved ADC. The method can also include receiving a plurality of filter coefficients that correspond to the mismatches in the IADC signal. The method can further include applying correction filters to the IADC signal. Each correction filter can implement one of the plurality of filter coefficients. The method can still further include subtracting the output of each of the correction filters from a delayed version of the IADC signal to form a corrected IADC signal.

DETAILED DESCRIPTION

Systems and method are described for determining correcting mismatches of an interleaved analog-to-digital converter (IADC) signal. The systems and methods described herein do not require an estimation of individual gain and/or timing mismatches. Rather, the mismatches of in IADC signal can be modeled as a plurality of frequency domain mismatch profiles. From estimates of these mismatch profiles, correction filters can be provided and the correction filters can be employed to remove the mismatches from the IADC signal.

In general, for an interleaved analog-to-digital converter (ADC) with M number of ADCs (where M is an integer greater than one), there are M−1 spurs. As used herein, the term "spur" corresponds to a spurious tone that interferes with the output of the interleaved ADC. Throughout this disclosure, these spurs are referred to as "images" of tones, since the spurs are correlated to the tones and related to the frequency location of the input in the manner described herein. For purposes of simplification of explanation, throughout this disclosure, an example is employed where there are 4 ADCs. In this situation, for an input tone at a frequency of $f_0$ and an amplitude of $A_0$, an output of the interleaved ADC can have three spurs occur due to the mismatches. In such a situation, the images of the tone can occur at $f_0+f_s/4$ ($f_s$ is the sampling frequency of the interleaved ADC), $f_0+2f_s/4$ and $f_0+3f_s/4$, with respective complex amplitudes of $G_1(f_0)A_0$, $G_2(f_0)A_0$ and $G_3(f_0)A_0$. It is noted that the frequencies $f_0+f_s/4$, $f_0+2 f_s/4$, $f_0+3 f_s/4$, etc. can be aliased to frequencies between $-f_s/2$ and $f_s/2$ due to the ADC sampling. Based on this information, the systems and methods described herein can estimate the three components $G_1(f)$, $G_2(f)$ and $G_3(f)$ for frequencies across a band. The three components can be converted into filter coefficients that can be employed in correction filters to reduce/remove the effects due to the mismatches in the output of the interleaved ADC. Accordingly, the systems and methods described herein can reduce/eliminate mismatches from an interleaved ADC signal.

Figure 1:
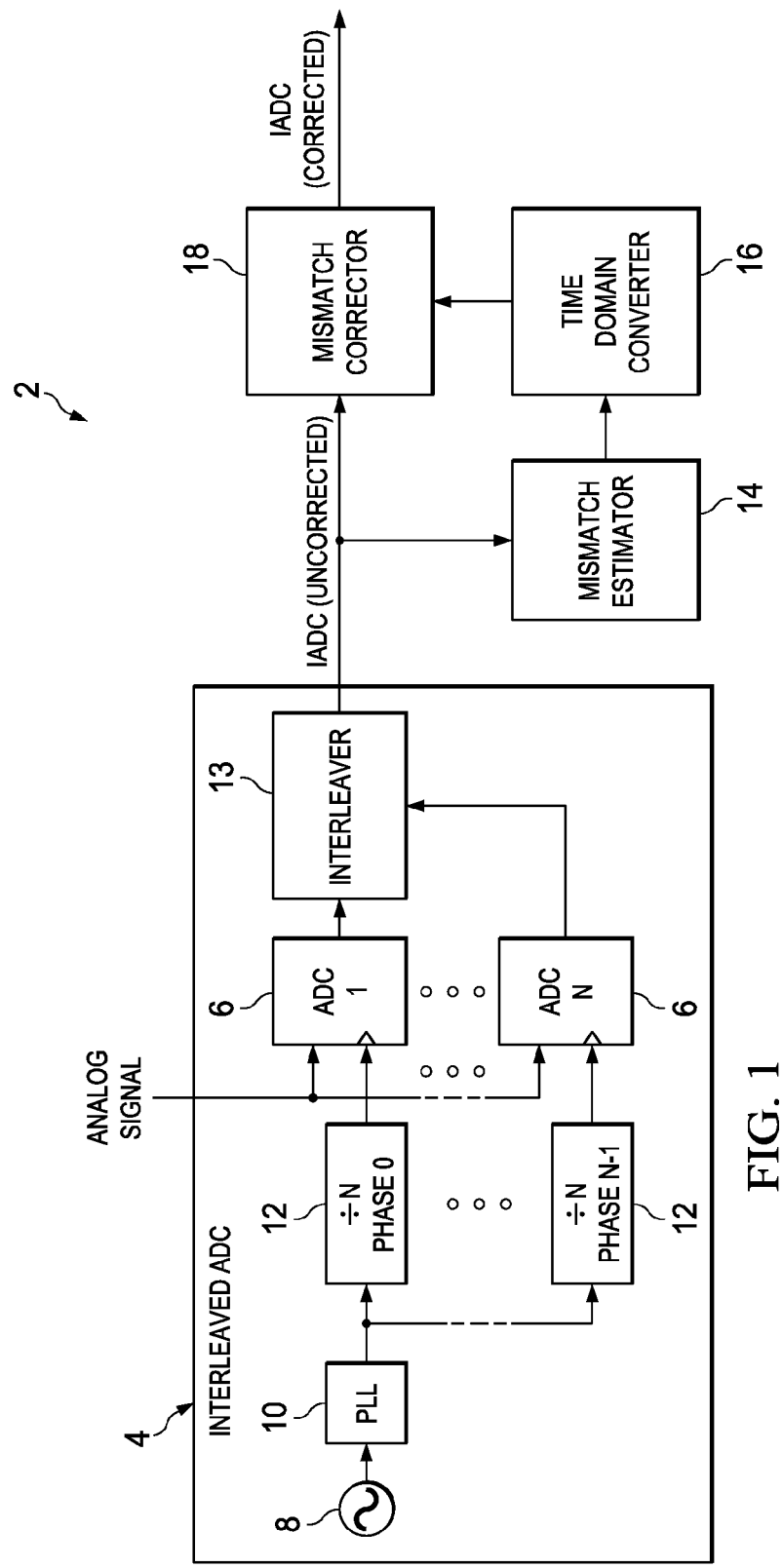
FIG. 1 illustrates an example of a system for correcting mismatches of an interleaved analog-to-digital converter (ADC).

FIG. 1 illustrates a block diagram of a system 2 for correcting mismatches in an interleaved ADC 4, which in some examples can be referred to as an ADC interleaver. The system 2 can be implemented, for example, as a circuit, such as an integrated circuit (IC) chip. For instance, the system 2 could be implemented as an Application Specific Integrated Circuit (ASIC) chip. In some examples, portions of the system 2 can be implemented as firmware accessible by a microcontroller. Additionally or alternatively, some of the blocks illustrated can be implemented as logic implemented on a field programmable gate array (FPGA) or a combination of logic and firmware. Moreover, although each block of the system 2 is shown and described as performing specific functions, it is to be understood that in other examples, the operations of each block can be performed by other blocks and/or in cooperation with multiple blocks.

The interleaved ADC 4 can include an array of N number of ADCs 6 that can sample an analog signal (labeled in FIG. 1 as "ANALOG SIGNAL"). The interleaved ADC 4 can be a time-interleaved ADC. A sample clock causes each of the N number of ADCs 54 to sample the analog signal. Thus, at each Nth sample, a given ADC 6 samples the analog signal. Output from each of the N number of ADCs 6 is interleaved (e.g., multiplexed) and output as an interleaved ADC ("IADC") signal.

More particularly, in the system 2, a clock signal 8 can be provided to a phase locked loop (PLL) 10 that can provide a phase-locked clock signal to N number of frequency dividers 12. The frequency dividers 12 can each control the sampling of a corresponding ADC 6. In some examples, the PLL 10 can output a clock signal and each frequency divider 12 can divide the output of the PLL 10 by N. For instance, in situations where the output of the PLL 10 has a frequency of 1 GHz, and there are four (4) ADCs 6, each of the frequency dividers 12 could have an output with a frequency of 250 MHz at different phases. The output from each of the ADCs 6 can be interleaved (e.g., multiplexed) by an interleaver 13 and output as an IADC signal. It is to be understood that in some examples, the clock signal 8 can be generated internally at the interleaved ADC 4 or external to the interleaved ADC 4 and/or the system 2.

Due to inherent fabrication and design tolerances, each individual ADC 6 has a unique gain, sampling time offset and bandwidth and other unique characteristics. Thus, a given ADC 6 has at least gain, sampling time instance and bandwidth mismatches or some combination thereof relative to a reference ADC 6. The IADC signal includes N−1 number of spurs that are a result of the mismatches between the individual ADCs 6. The profile of these N−1 spurs as a function of the input frequency can be referred to as a mismatch profile. Accordingly, the IADC output by the interleaved ADC 52 is referred to as an uncorrected IADC signal (labeled in FIG. 1 as "IADC (UNCORRECTED)"). The system 2 can correct these mismatches.

The uncorrected IADC signal can be provided to a mismatch estimator 14. The mismatch estimator 14 can employ a Fast Fourier Transform (FFT) and calculate an instantaneous frequency domain mismatch estimate for each input frequency. Data characterizing the instantaneous frequency domain estimate and the corresponding uncertainty can be averaged over time by the mismatch estimator 14. Additionally, the mismatch estimator can interpolate, extrapolate and/or smooth the time averaged frequency domain mismatch profile estimate for each the ADCs 6 over a range of frequencies, including band edges beyond a band of interest. In this manner, the mismatch profile estimator 18 can estimate a frequency domain mismatch profile for each of the ADCs 6 in the interleaved ADC 4.

The mismatch estimator 14 can provide the frequency domain mismatch profiles of each of the ADCs 6 to a time domain converter 16. The time domain converter 20 estimates a mismatch corrector profile and then can employ an Inverse Fast Fourier Transform (IFFT) to convert the mismatch corrector profile of each of the ADCs 6 into filter coefficients in the time domain. The filter coefficients can be provided to a mismatch corrector 20.

The mismatch corrector 18 can apply a transformation on the filter coefficients and generate (equivalent) transformed filter coefficients. The mismatch corrector 18 can include "direct" path and a "correction" path. The direct path of the mismatch corrector 18 can include a simple delay (and no mismatch correction) that can delay the uncorrected IADC signal for a number of samples equal to a multiple of the number of ADCs 6, N. The correction path can include parallel branches that each include a correction filter that applies a corresponding transformed filter coefficient.

As described herein, the correction filters can be configured to represent only filter mismatches, where mismatches are small. Thus, the filter coefficients have a small value, such as a value between $10^{-5}$ and $10^{-2}$. Therefore, the most significant bits (MSBs) of the filter coefficients are zero and can be removed. This removal of MSBs reduces the number of bits required for the filter coefficients. Additionally, the mismatch corrector 18 can quantize the input of the correction filters to remove the Least Significant Bits (LSBs) of the input signal to the correction filters, thereby resulting a lower bit width. The removal of the LSBs of the input and reduced number of bits needed for the filter coefficients reduces complexity and the overall power consumption of the mismatch corrector 18. Additionally, to remove spurs caused by the quantizing of the inputs to the corrector filter, the mismatch corrector 18 can dither the inputs to the correction filters by adding random numbers to the inputs. The random numbers remove periodicity of the quantization noise, thereby making the quantization noise random, and eliminating (e.g., preventing) spurs due to quantization at the output of the correction filters. The outputs of the correction filters can be subtracted from the uncorrected IADC signal to produce a corrected IADC signal (labeled in FIG. 1 as "IADC (CORRECTED)").

Figure 2:
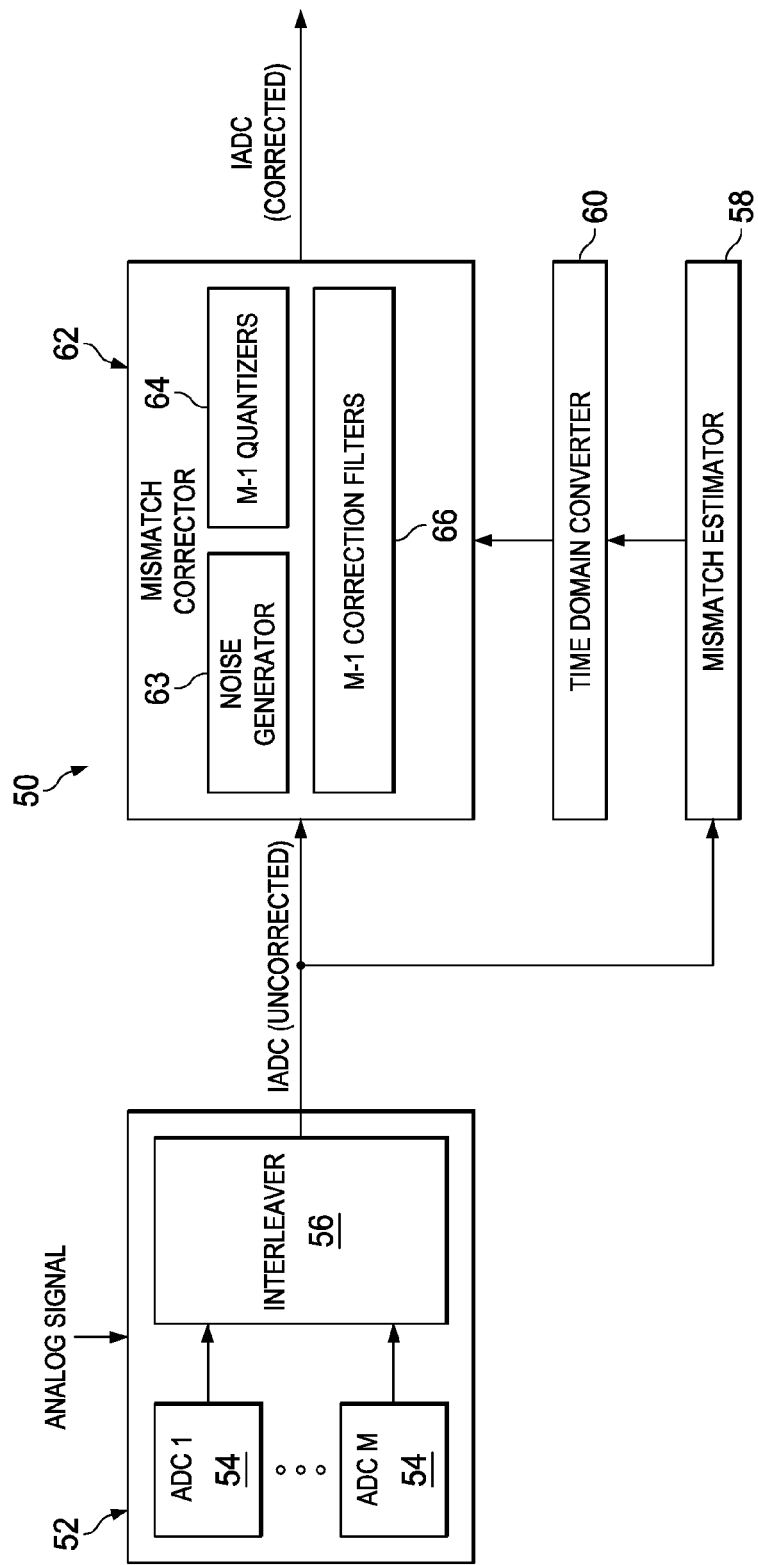
FIG. 2 illustrates another example of a system correcting mismatches of an interleaved analog-to-digital converter (ADC).

FIG. 2 illustrates another block diagram of a system 50 for correcting mismatches in an interleaved ADC 52. The system 50 can be employed for example, to implement the system 2 illustrated in FIG. 1. The interleaved ADC 52 can include M number of parallel ADCs 54 that each sample an analog signal (labeled in FIG. 2 as "ANALOG SIGNAL"), where M is an integer greater than one. For purposes of simplification of explanation, in a simplified given example, (hereinafter, "the given example") it is presumed that there are 4 ADCs 54 in interleaved ADC 52, but in other examples more or less ADCs 54 can be employed. The output from each of the 4 ADCs 54 can be interleaved (e.g., multiplexed) by an interleaver 56 and output as an uncorrected IADC signal (labeled in FIG. 2 as "IADC (UNCORRECTED)"). The uncorrected IADC signal can be a real signal.

A tone input to an interleaved ADC produces, in general, M−1 spurs due to the mismatch between the ADCs 54. Correspondingly, $G_k(f)$ can represent a frequency domain mismatch profile of the interleaved ADC 52, where k=1 . . . M−1. In the given example, for a given input tone at a frequency of $f_0$ and an amplitude of $A_0$, with a sampling frequency of $f_s$, due to the mismatches, the given input tone causes an extra tone with a complex amplitude of $G_k(f_0)A_o$ at a frequency of $f_0+k*f_s/M$ (k=1 . . . M−1), which extra tone can be referred to as an image of the given input tone. Moreover, in the given example with 4 interleaved ADCs, an input tone will generate 3 other tone images.

Figure 3:
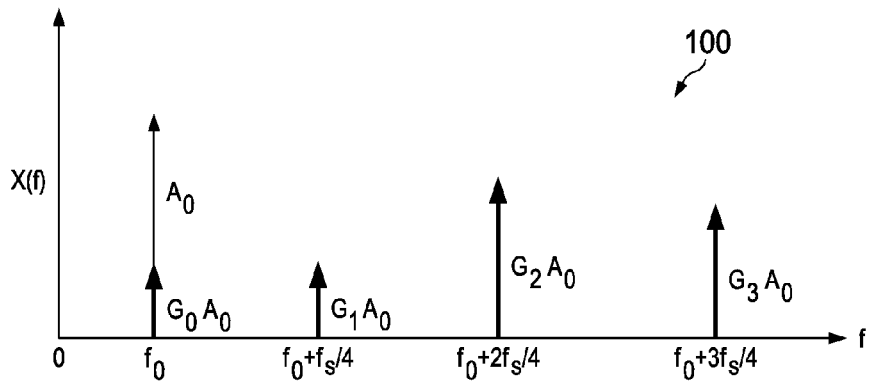
FIG. 3 illustrates an example of a graph depicting an output of an interleaved ADC without mismatch correction.

FIG. 3 illustrates an example of a graph 100 of an uncorrected IADC output represented in the given example with a given input tone of $A_0$ at a frequency of $f_0$. In the graph 100, amplitude of a signal, in decibels relative to a carrier signal (dBc) are plotted as a function of frequency, f. As illustrated in the graph 100, in the given example, there are 3 images of the given input tone, $A_0$ at the frequencies, $f_0+f_s/4$, $f_0+2f_s/4$ and $f_0+3f_s/4$ with respective complex amplitudes $G_1(f_0)A_0$, $G_2(f_0)A_0$ and $G_3(f_0)A_0$ for the input tone of amplitude $A_0$. Additionally, there is an image of the input tone $A_0$ at $f_0$ with a complex amplitude of $G_0(f_0)A_0$. Equation 1 characterizes the uncorrected IADC output in the frequency domain, Y(f).

$$Y(f) = X(f)e^{-j2\pi f\Delta} + \sum_{k1=0}^{3} X\left(f - \frac{k1 f_s}{4}\right) G_{k1}\left(f - \frac{k1 f_s}{4}\right) \quad \text{Equation 1}$$

Referring back to FIG. 2, the uncorrected IADC signal can be provided to a mismatch estimator 58. The mismatch estimator 58 can convert the IADC signal into the frequency domain, thereby generating FFT bins (e.g., blocks of FFT data) that contain portions of a discrete frequency domain representation of the uncorrected IADC signal. Moreover, the mismatch estimator 58 can employ frequency domain analysis techniques to determine an estimate of the frequency domain mismatch profile $G_k(m)$. The estimate of the frequency domain mismatch profile, $G_k(m)$ can be provided to a time domain converter 60.

The time domain converter 60 can modify an estimate for $G_k(m)$ at the $0^{th}$ FFT bin and a last FFT bin, namely a bin at $f_s/2$ (e.g., $128^{th}$ bin) to reflect the fact that a correction filter $h_i$ (which is employed to remove the mismatches, as explained herein) is a real filter. Once $h_i$ is a real filter, $G_2(0)$ and $G_2(128)$ are real, $G_3(0)=G_1*(0)$ and $G_3(128)=G_1*(128)$. These conditions can be imposed on the $G_k(m)$ estimates. The remaining tones can be linearly interpolated and extrapolated by the time domain converter 60 to generate an estimate of $G_k(m)$ for frequencies across a band of interest to generate an estimate for a continuous frequency domain mismatch profile, $G_k(f)$.

In some examples, the time domain converter 60 can employ a shaping filter to implement smoothing for regions outside of the band of interest to predetermined boundary conditions. For instance, at each band edge, samples are held for some tones and gradually tapered down (beyond the band of interest) to ensure less discontinuity for a last tone (e.g., a tone $f_s/2$, such as $128^{th}$ tone) in a first Nyquist frequency band, namely a signal frequency between 0 and $f_s/2$ for a sampling rate, $f_s$ of about 1 GHz. Additionally, smoothing can be implemented for both band edges, namely a first bin (e.g., the $0^{th}$ bin) at a first band edge and a last bin ($128^{th}$ bin) at a second band edge for a second Nyquist frequency band (between $f_s/2$ to $f_s$) and a third Nyquist frequency band ($f_s$ to $3f_s/3$), etc. Moreover, in mixed mode, wherein input tones have different Nyquist frequency bands, but upon sampling, the input tones occupy distinct spectra and do not overlap, smoothing can be implemented on both the $0^{th}$ bin and the last bin. This smoothing can also ensure smooth frequency response to attain improved fidelity when converting to the time domain. In other examples, regions outside of the band of interest can be ignored (e.g., don't-care terms).

Once the estimation profile $G_k(f)$ is obtained, the time domain converter 60 can calculate a correction profile, $G_{corr}$ that can correct the mismatch accurately. It is noted $f_0$, $f_0+fs/4$, $f_0+2fs/4$ and $f_0+3fs/4$ are a set of frequencies that have signal-image relationship among themselves. That is, a tone at $f_0$ produces images at $f_0+fs/4$, $f_0+2fs/4$ and $f_0+3fs/4$ and a tone at $f_0+fs/4$ produces images at $f_0+2fs/4$, $f_0+3fs/4$ and $f_0$ (with aliasing). Equation 1 can be rewritten in a matrix formulation, to derive the uncorrected IADC output Y(f) in terms of the original input X(f) and the mismatch model as Equation 2. Equation 2 can be rewritten as a vector/matrix notation, characterized in Equation 3.

$$\begin{bmatrix} Y(f_0) \\ Y(f_0 + f_s/4) \\ Y(f_0 + 2f_s/4) \\ Y(f_0 + 3f_s/4) \end{bmatrix} = \left( I + \right. \quad \text{Equation 2}$$

$$\left. \begin{bmatrix} G_0(f_0) & G_3(f_0 + f_s/4) & G_2(f_0 + 2f_s/4) & G_1(f_0 + 3f_s/4) \\ G_1(f_0) & G_0(f_0 + f_s/4) & G_3(f_0 + 2f_s/4) & G_2(f_0 + 3f_s/4) \\ G_2(f_0) & G_1(f_0 + f_s/4) & G_0(f_0 + 2f_s/4) & G_3(f_0 + 3f_s/4) \\ G_3(f_0) & G_2(f_0 + f_s/4) & G_1(f_0 + 2f_s/4) & G_0(f_0 + 3f_s/4) \end{bmatrix} \right)$$

$$\begin{bmatrix} X(f_0) \\ X(f_0 + f_s/4) \\ X(f_0 + 2f_s/4) \\ X(f_0 + 3f_s/4) \end{bmatrix}$$

wherein:
$G_0(f)=-(G_1(f)+G_2(f)+G_3(f))$; and
I is a 4×4 identity matrix.

$$\overline{Y} = (I + \overline{G}) \overline{X} \quad \text{Equation 3}$$

wherein:
the "bar" on top of the variable indicates a vector/matrix notation.

In Equation 3, a correction matrix, $G_{corr}$ can operate on the Y vector and correct this mismatch and such that the X vector can be calculated. The corrector matrix, $G_{corr}$ can be derived in a format where there is a direct path (e.g., a path with a delay) and a correction path (e.g., branches with correction filters). Thus, $G_{corr}$ (I−GcorrY=X. Additionally, Gcorr=I−I+ G−1. Gcorr can require significant computational resources to compute since the calculation of $\overline{G_{corr}}$ includes an inverse computation of a 4×4 matrix. However, since all elements of G are small (e.g., between about $10^{-5}$ and $10^{-2}$), a simple solution for this case is $\overline{G_{corr}} = \overline{G}$, which results in $(I - \overline{G_{corr}})\overline{Y} =$ $\bar{X}-\bar{G}^2\bar{X}$. Accordingly, the corrected IADC signal has an error of $\bar{G}^2\bar{X}$ which is very small error of $O(G^2)$ (e.g., a second order of error) if G is also small (e.g., between $10^{-5}$ and $10^{-2}$). In situations where better accuracy than $O(G^2)$ is need or desired, then a relationship of $\bar{G}_{corr}=\bar{G}-\bar{G}^2$ can be selected, which will result in an error of $\bar{G}^3\bar{X}$ which is $O(G^3)$ (e.g., a third order of error). This method can be extended to $\bar{G}_{corr}= \bar{G}-\bar{G}^2+\ldots+(-1)^n\bar{G}^{n-1}$, which results in an error of $\bar{G}^n\bar{X}$ which is $O(G^n)$. Accordingly, this method enables selection of as low a residual error as needed at the cost of increased computational complexity. However, for purposes of simplification of explanation, examples described herein employ the case of $\bar{G}_{corr}=\bar{G}$ thereby resulting in an error $O(G^2)$.

As noted, the system 2 can correct the mismatches characterized in Equation 1, caused by the interleaved ADC 52. The mismatch corrected output B(f) can be written in the frequency domain as Equation 4.

$$B(f) = Y(f)e^{-j2\pi f\Delta} - \sum_{k1=0}^{3} Y\left(f - \frac{k1 f_s}{4}\right) G_{k1}\left(f - \frac{k1 f_s}{4}\right),$$ Equation 4 wherein the notation $G_k(f)$ is employed instead of $G_{corr\_k}(f)$ for purposes of simplification of explanation, but in other examples, $G_{corr\_k}(f)$ can be employed with higher order to reduce residual error.

The time domain converter 60 can employ an IFFT to the convert continuous frequency domain mismatch profile, $G_k(f)$ into a complex discrete time domain filter function, $g_k(m)$. Each of the complex filter functions $g_k(m)$ may correspond to complex filters (e.g., filters with coefficients that may or may not be complex numbers). Similarly, Equation 4 can be rewritten in the time domain as Equation 5.

$b(n)=y(n-\Delta)-y(n)*g_0(n)-(y(n)*g_1(n))\cdot j^n-(y(n)*g_2(n))\cdot (-1)^n-(y(n)*g_3(n))\cdot(-j)^n$ Equation 5

Figure 4:
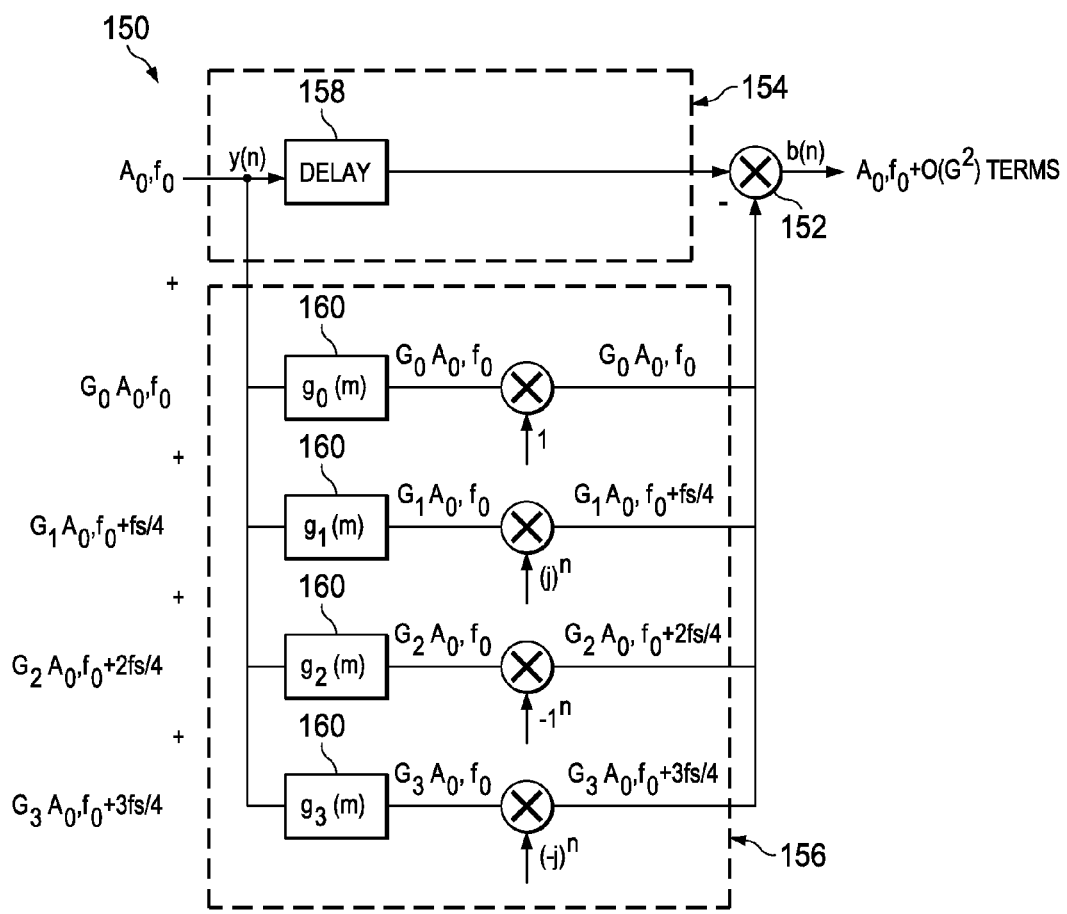
FIG. 4 illustrates an example of a conceptualized discrete time domain mismatch corrector model.

FIG. 4 illustrates a conceptualized discrete time domain mismatch corrector model 150 that can correct the mismatches characterize by the complex filter functions, $g_k(n)$. The conceptualized discrete time domain mismatch corrector model 150 can receive the uncorrected IADC signal y(n). In the conceptualized discrete time domain mismatch corrector model 150, the outputs of each of the illustrated branches are subtracted from the input, y(n). Thus, the output of the conceptualized discrete time domain mismatch corrector model 150, b(n) (characterized by Equation 5) can be a corrected IADC output.

The conceptualized discrete time domain mismatch corrector model 150 can include paths, namely a direct path 154 and a correction path 156. The direct path 147 can include a delay 158 that can delay the uncorrected IADC signal, y(n) by a multiple of M samples (the number of ADCs 54). However, the direct path 154 does not include a correction filter. The output of the correction path 156 can be provided to the summer 152.

The correction path 156 (in parallel with the direct path) is formed of M number of branches that each include a correction filter 160 implemented as a complex filter function, $g_k(m)$. In the example illustrated in FIG. 4, there are 4 such correction filters 160, $g_0(m)\ldots g_3(m)$, but in other examples, more or less correction filters 160 could be employed. The output of each correction filter 160 can be provided to a summer 160, wherein the summer 160 subtracts the output from the correction path 156 from the output of the direct path 154.

In the given example, an input tone, $A_0, f_0$ includes the mismatch terms $G_0 A_0, f_0$, $G_1 A_0, f_0 + f_s/4$, $G_2 A_0, f_0 + 2 f_s/4$ and $G_3 A_0, f_0 + 3 f_s/4$ added into input for y(n). The conceptualized discrete time domain mismatch corrector model 150 subtracts the mismatch terms, $G_0 A_0, f_0$, $G_1 A_0, f_0 + f_s/4$, $G_2 A_0, f_0 + 2 f_s/4$ and $G_3 A_0, f_0 + 3 f_s/4$ from the input, y(n), such that the output is $A_0, f_0 + O(G^2)$ terms, wherein "$O(G^2)$ terms" represents second order errors that be reduced by additional computations, as explained herein.

The time domain converter 60 can convert the time domain filter functions $g_k(m)$ into filter coefficients $h_i(m)$ by employing Equation 6. Each of the filter coefficients, $h_i(m)$ can correspond to real filters (e.g., filters that have real number coefficients). As noted, since $h_0(m)=0$, indicating that there is no correction applied to the output of the reference ADC 54, and thus, $h_0(m)$ does not need to be implemented. Accordingly, there are less filter coefficients $h_i(m)$ that are implemented than the number of $g_k(m)$ filters functions.

$$h_i(m) = \sum_{k=0}^{M-1} g_k(m) e^{\frac{j2\pi i k}{M}}, \text{ for all } m$$ Equation 6

Wherein:

$h_0(m)=0$.

Figure 5:
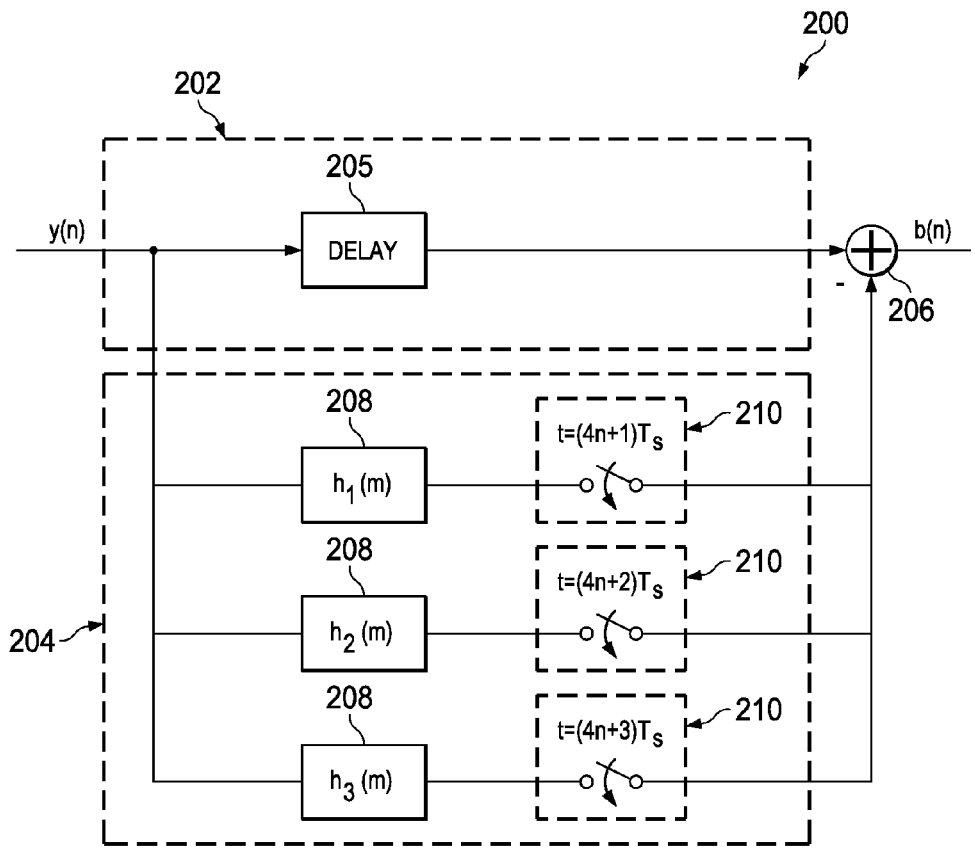
FIG. 5 illustrates an example of a mismatch corrector.

The filter coefficients, $h_i(m)$ can be provided to a mismatch corrector 62 that can receive the uncorrected IADC signal from the interleaved ADC 52. FIG. 5 illustrates a diagram of a mismatch corrector 200 that could be employed to implement the mismatch corrector 62 illustrated in FIG. 2. The mismatch corrector 200 can operate in the time domain. Additionally, the mismatch corrector 200 can be employed to implement a mismatch corrector substantially equivalent to the conceptualized discrete time domain mismatch corrector model 150 illustrated in FIG. 4. In FIG. 5, an input signal, y(n) represents the observed output IADC output of the interleaved ADC 52, such as the uncorrected IADC signal illustrated in FIG. 2. The mismatch corrector 200 also includes an output signal, b(n) that represents the corrected IADC signal of FIG. 2 (labeled in FIG. 2 as "IADC CORRECTED"). The output signal (the corrected IADC signal of FIG. 2) is a real signal.

The conceptualized discrete time domain mismatch corrector model 200 can include two paths, namely a direct path 202 and a correction path 204. The direct path 202 can include a delay 205 that can delay the uncorrected IADC signal, y(n) by a multiple of M samples (the number of ADCs 54). However, the direct path 202 does not include a correction filter. The output of the correction path 202 can be provided to the summer 206.

The correction path 204 can include the remaining subset of the parallel branches. Each branch of the correction path 204 can include a corresponding correction filter 208, $h_1(n)\ldots h_{M-1}(n)$. As noted, each correction filter 208 can be a real filter. Thus, real mismatches relative to the reference ADC 54 caused by each of the 2nd to Mth ADCs 54 can be corrected with the corresponding correction filter 208, $h_1(n)\ldots h_{M-1}(n)$ that are included on the 2nd to Mth parallel branches in the correction path 202 of the mismatch corrector 200. Each correction filter 208, $h_1(n)\ldots h_{M-1}(n)$ represents a mismatch due to a corresponding one of the ADC's 54 individual, gain, sampling time, bandwidth and/or other characteristics relative to the reference ADC 54. Each correction filter 208, $h_1(n)$ ... $h_{M-1}(n)$ can employ a respective one of the filter coefficients, $h_i(m)$ that can be received from the time domain converter 60 illustrated in FIG. 2.

In the correction path 202, the output of each correction filter 208 can be coupled to a switch 210. The switches 210 close in round-robin fashion. That is, once in M samples of the IADC, each of the switches 210 close, and the output from each of the correction filters 208, $h_1(n) \ldots h_{M-1}(n)$, is subtracted by a summer 206 from the delayed version of the input signal output by the direct path 202, y(n) to form the output signal, b(n). Accordingly, each of the correction filters 208 can be employed to subtract a portion of the mismatch in the uncorrected IADC signal, y(n) contributed by a corresponding ADC 54 sequentially, one after each other (in round-robin fashion).

Referring back to FIG. 2, the filter coefficients $h_i(m)$ are small (e.g., between $10^{-5}$ and $10^{-2}$) since the filter coefficients represent only the mismatch between an ADC 54 and the reference ADC 54. Accordingly, some of the MSBs of the filter coefficients $h_i(m)$ are zero, and only the LSBs of the filter coefficients $h_i(m)$ are needed to represent the mismatches. Thus, the MSBs of the filter coefficients $h_i(m)$ that are zero can be removed. The mismatch corrector 62 can include a noise generator 63 that can add random numbers to the uncorrected IADC signal.

Figure 6:
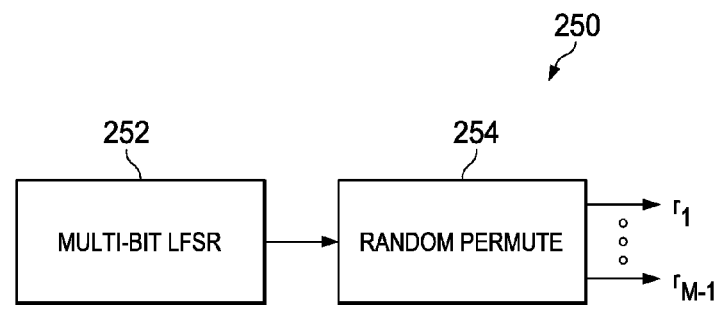
FIG. 6 illustrates an example of a noise generator.

FIG. 6 illustrates an example of a noise generator 250 that can be employed to implement the noise generator 63 of FIG. 2. The noise generator 250 can include a multi-bit linear feedback shift register (LFSR) 252 that can output a continuous stream of numbers within a predefined interval that can be received by a random permute 254. The random permute 254 can randomize an order of the stream of number and output M−1 (M, being the number of ADC 54 in FIG. 2) noise signals, $r_1$ to $r_{M-1}$. By generating the noise signals, $n_1$ to $n_{M-1}$ in this manner, the noise numbers $r_1$ to $r_{M-1}$ are relatively uniformly distributed about the predefined interval.

Referring back to FIG. 2, the output of the noise generator 63 can be inserted into the uncorrected IADC signal to form a noisy uncorrected IADC signal. M−1 number of quantizers 64 can quantize the noisy uncorrected IADC signal to remove the LSBs to the input of the correction filters. Each of the M−1 number of quantized signals can be input into a corresponding one of M−1 number of correction filters 66. The output of each of the M−1 number of correction filters 66 can be removed (e.g., subtracted) from the IADC signal to generate a corrected IADC signal (labeled in FIG. 2 as "IADC corrected").

Figure 7:
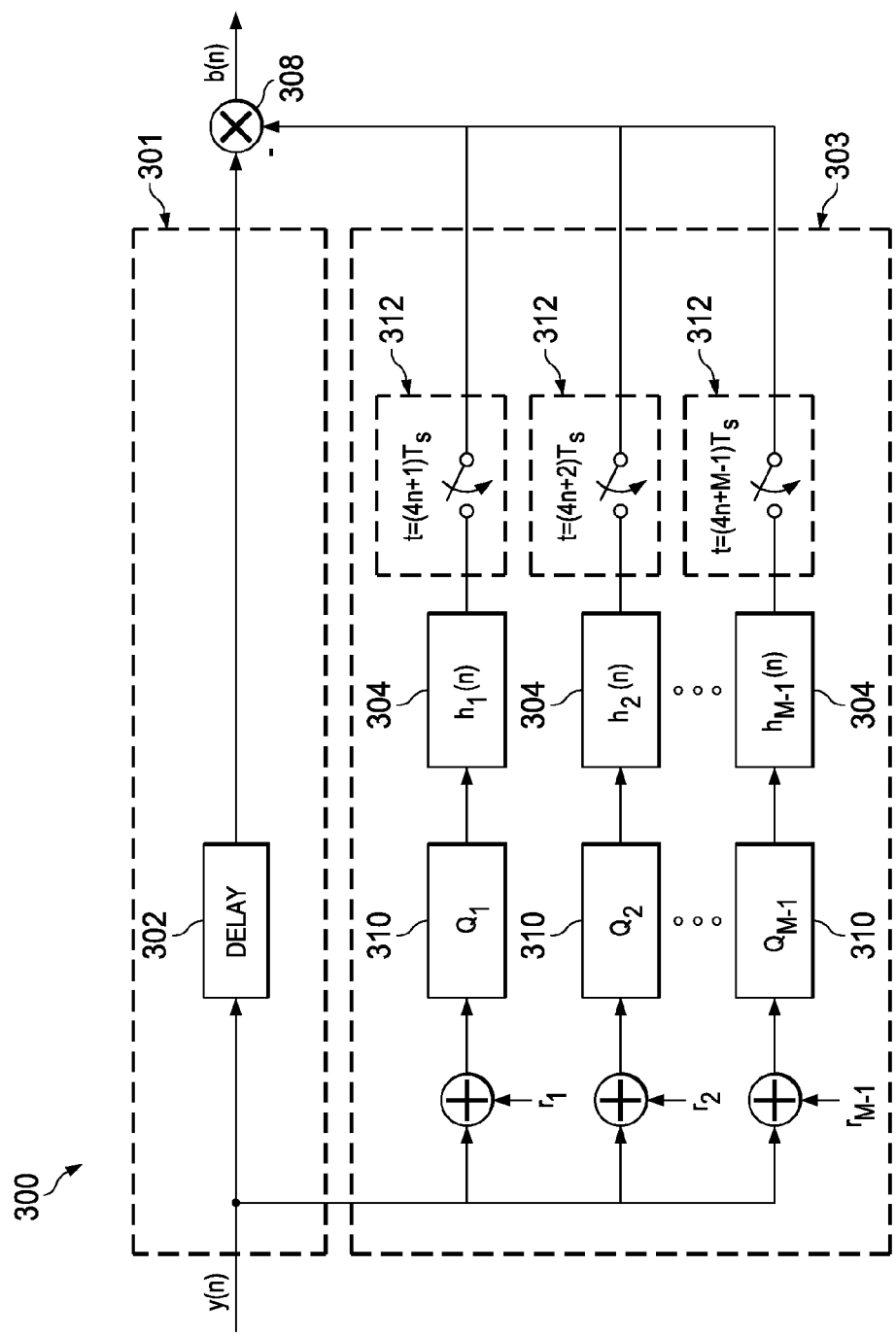
FIG. 7 illustrates another example of a mismatch corrector.

FIG. 7 illustrates detailed diagram of another mismatch corrector 300 that could be employed to implement the mismatch corrector 62 illustrated in FIG. 2. The mismatch corrector 300 can operate in the time domain. Additionally, the mismatch corrector 300 can be employed to implement a mismatch corrector substantially equivalent to the conceptualized discrete time domain mismatch corrector model 150 illustrated in FIG. 4. In FIG. 7, an input signal, y(n) represents the observed output IADC output of the interleaved ADC 52, such as the uncorrected IADC signal illustrated in FIG. 2. The mismatch corrector 300 also includes an output signal, b(n) that represents the corrected IADC signal of FIG. 2 (labeled in FIG. 2 as "IADC CORRECTED").

The mismatch corrector 300 can include M number of parallel branches (equal to the M number of ADCs 54 of FIG. 2). The mismatch corrector 300 can include direct path 301 and a correction path 303. The direct path 301 of the mismatch corrector 300 can correspond to the reference ADC 54, and is illustrated as being the first branch of the mismatch corrector 300. The direct path 301 can include a simple delay 302 that receives the input y(n) (the uncorrected IADC signal) to generate a delayed uncorrected IADC signal. The delay 302 can apply delay of a multiple of M samples, (the number of ADCs 54) to the uncorrected IADC signal to ensure that the output of the reference ADC 54 is unaltered. The direct path 301 does not apply correction to the uncorrected IADC signal. It is noted that in some examples, a delay other than a multiple of M can be selected. In such a situation, a different constraint than $h_0(m)=0$ can be selected, thereby selecting another ADC 54 as a reference ADC 54. For example, if the delay is in the form of pM+1, where p is an integer, then ADC 1 (the second of the M number of ADCs. 54) can be selected as the reference ADC 54 instead of ADC 0 (the first ADC 54). In this situation, $h_1(m)$ can be set to '0' and $G_0(f)$ can be selected appropriately to realize this condition. Moreover, in such a situation, $h_0(m)$, $h_2(m)$ and $h_3(m)$ would correct the mismatches in ADC 0, 2 and 3 with respect to ADC 1. In a similar manner any of the ADCs 54 can be selected as the reference ADC 54.

The correction path 303 can include the remaining subset of the parallel branches. Each branch of the correction path 304 can include a corresponding correction filter 304, $h_1(n) \ldots h_{M-1}(n)$. Mismatches relative to the reference ADC 54 caused by each of the 2nd to Mth ADCs 54 can be corrected with the corresponding correction filter 304, $h_1(n) \ldots h_{M-1}(n)$ that are included on the 2nd to Mth parallel branches in the correction path 303 of the mismatch corrector 300. Each correction filter 304, $h_1(n) \ldots h_{M-1}(n)$ represents a mismatch due to a corresponding one of the ADC's 54 individual, gain, sampling time, bandwidth and/or other characteristics relative to the reference ADC 54. Each correction filter 304, $h_1(n) \ldots h_{M-1}(n)$ can employ a respective one of the filter coefficients, $h_i(m)$ that can be received from the time domain converter 60 illustrated in FIG. 2. Each of the filter coefficients $h_i(m)$ are small (e.g., between $10^{-5}$ and $10^{-2}$) since the filter coefficients $h_i(m)$ only represent the mismatch between a given filter coefficient $h_i(m)$ the reference ADC 54. Accordingly, the MSBs of the filter coefficients $h_i(m)$ will be zero, and the LSBs of the filter coefficients $h_i(m)$ represent the mismatch. Therefore, MSBs of the filter coefficients $h_i(m)$ that are zero can be removed.

Additionally, as is illustrated, at each branch of the mismatch corrector 300, a noise signal $r_1 \ldots r_{M-1}$ can be added in to the input signal y(n) to generate a noisy IADC signal. Each the noise signals $r_1 \ldots r_{M-1}$ can be provided by a noise generator, such as the noise generator 63 of FIG. 2 and/or the noise generator 250 of FIG. 6. Each of the 2nd to Mth branches in the corrector path 301 can also include a quantizer 310 (labeled in FIG. 7 as "$Q_1 \ldots Q_{M-1}$") that can quantize each noisy IADC signal. The quantization can reduce the bit width of the input into each correction filter 304. The number of bits quantized by each of the quantizers 310 can be based on the gain of a corresponding correction filter 304 and/or the overall quantization noise of the mismatch corrector 300. In particular, as noted, the filter coefficients are small and hence any noise in the input to the correction filters 304 is suppressed by the correction filters 304. Thus, the number of bits to be quantized by the quantizers 310 is determined to ensure that the extra quantization noise at the output of the mismatch corrector 300 due to this quantization by the quantizers 310 is smaller (at least about 10 dBFS less) than the overall thermal noise of the interleaved ADC (e.g., about −10 dBFS). Moreover, such a reduction of bit width reduces the complexity and the power consumed by the mismatch corrector 300.

Furthermore, adding the random number $r_1 \ldots r_{M-1}$ can dither the inputs to the correction filters 304. The dithering can function to remove periodicity of the quantization noise caused by the quantizers 310, thereby making the noise random, and preventing spurs due to the quantizing from appearing at the corrected IADC output.

In the correction path 303, the output of each correction filter 304 can be coupled to a switch 312. The switches 312 close in round-robin fashion. That is, once in M samples of the IADC, each of the switches 312 close, and the output from each of the correction filters 304, $h_1(n) \ldots h_{M-1}(n)$, is subtracted by a summer 308 from the delayed version of the input signal output by the direct path 301, $y(n)$ to form the output signal, $b(n)$. Accordingly, each of the correction filters 304 can be employed to subtract a portion of the mismatch in the uncorrected IADC signal, $y(n)$ contributed by a corresponding ADC 54 sequentially, one after each other (in round-robin fashion).

As noted, by reducing the bit width of the signal input into the correction filters 304, the power requirements of the mismatch corrector 300 can be reduced. Additionally, the mismatch corrector 300 has a relatively simple implementation, since only M−1 filters, which compute an output once every M samples of the IADC, are needed. For example, by employing the delay 302, the correction filters 304 of the correction path 301 represent only the mismatches, thereby causing the MSBs of the filter coefficients to be zero. Accordingly, removal of these MSBs from the coefficients, $h_i(m)$ enables lower bit widths for the same precision of the filter coefficients.

Figure 8:
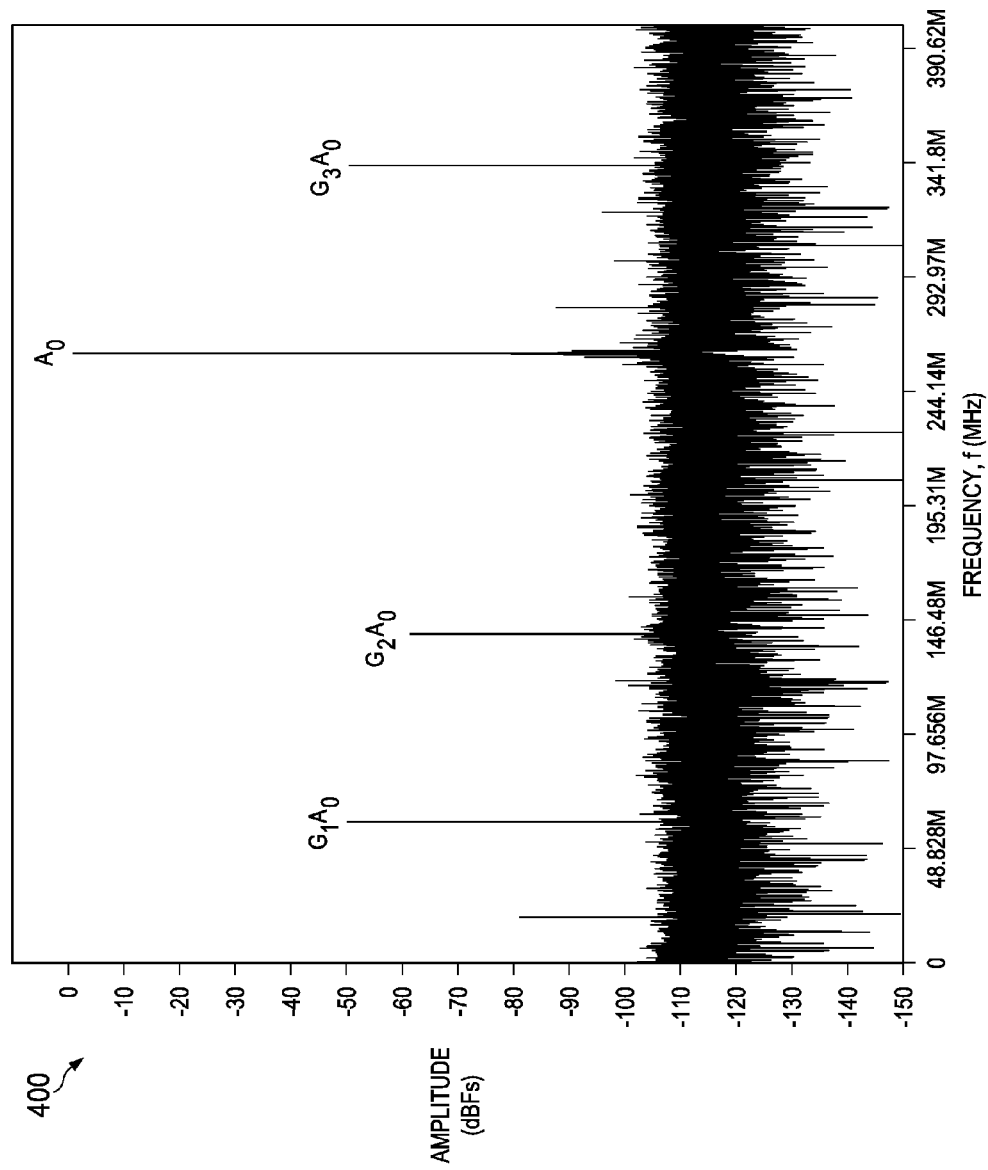
FIG. 8 illustrates a graph that depicts an example output of an interleaved ADC without mismatch correction.

FIG. 8 illustrates an example a graph 400 of an uncorrected IADC output represented in the given example. In the graph 400, amplitude of a signal, in dBc is plotted as a function of a sampling frequency, $f_s$, in Megahertz (MHz). As illustrated in the graph 400, in the given example, there are 3 images of an input tone, $A_0$ at the frequencies, $f_0+f_s/4$, $f_0+2f_s/4$ and $f_0+3f_s/4$ with respective complex amplitudes of $G_1(f_0)A_0$, $G_2(f_0) A_0$ and $G_3(f_0)A_0$ for the input tone of amplitude $A_0$.

Figure 9:
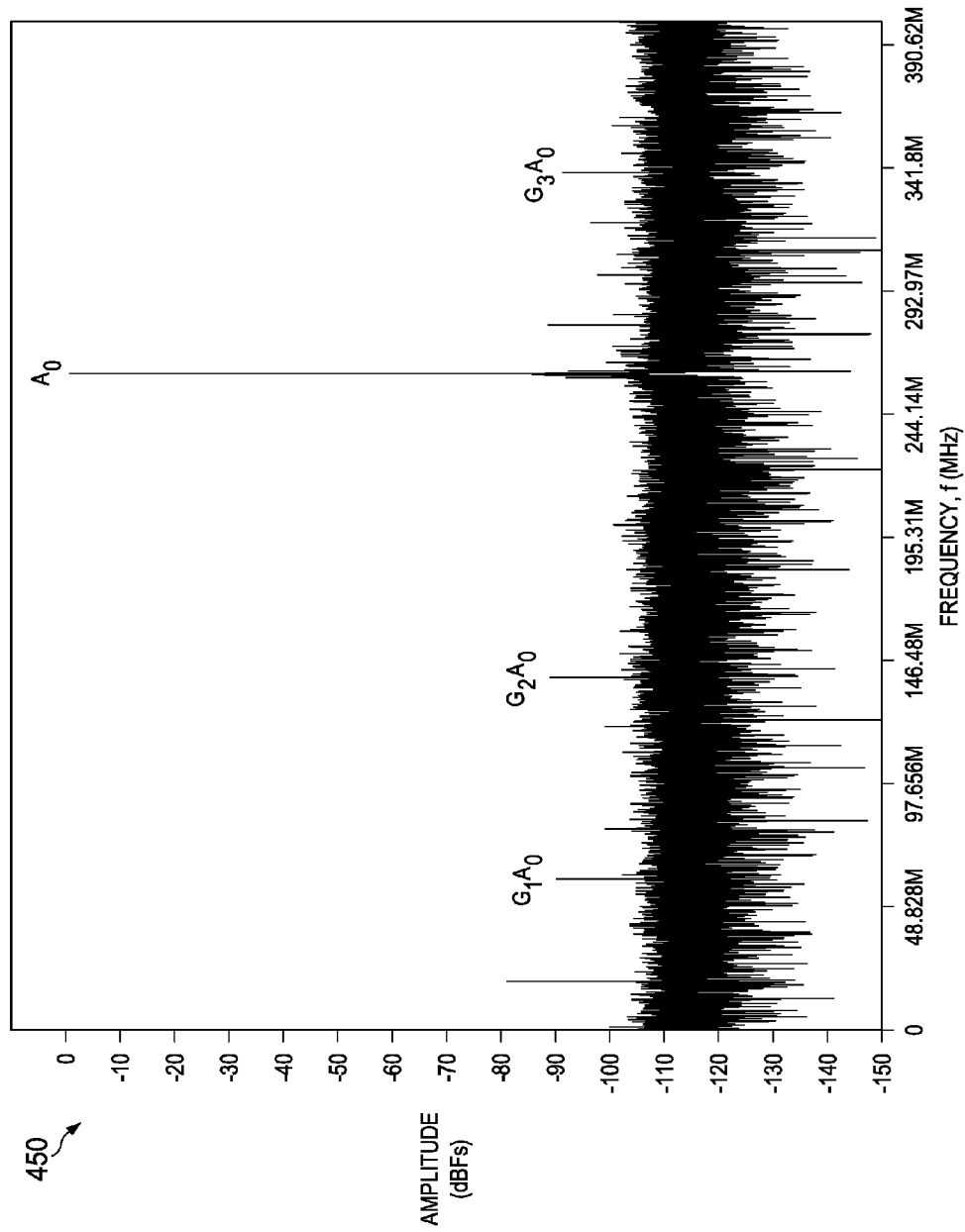
FIG. 9 illustrates an example of a graph depicting the output of the interleaved ADC illustrated in FIG. 8 after correction has been applied.

FIG. 9 illustrates an example of a graph 450 depicting a corrected IADC output represented in the given example, which corresponds to a corrected version of the graph 400 illustrated in FIG. 8. In the graph 450, amplitude of a signal, in dBc is plotted as a function of a input frequency in MHz. As illustrated in the graph 450, in comparison to the graph 400, the complex amplitude of the images of the tones $G_1A_0$, $G_2A_0$ and $G_0A_0$ generated from mismatches are reduced, thereby increasing the overall performance of the interleaved ADC 52 illustrated in FIG. 2.

Referring back to FIG. 2, the mismatch corrector 62 can output the corrected IADC signal (labeled in FIG. 2 as IADC (CORRECTED)). Thus, by employing the system 50, the corrected IADC signal can have the effects due to the mismatches (e.g., images of tones) substantially reduced, as is illustrated in FIG. 9.

Figure 10:
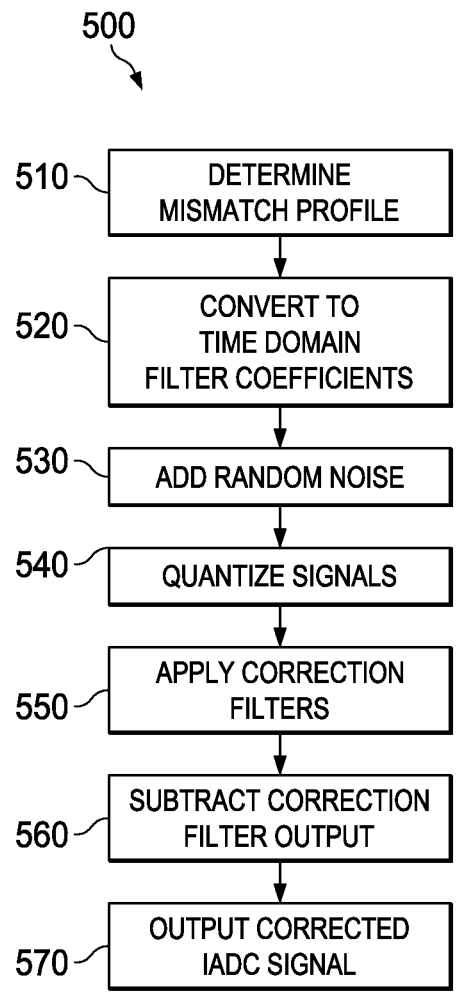
FIG. 10 illustrates an example of a method for correcting mismatches.

In view of the foregoing structural and functional features described above, an example method will be better appreciated with reference to FIG. 10. While, for purposes of simplicity of explanation, the example method of FIG. 10 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method. The example method of FIG. 10 can be implemented as instructions stored in an IC chip (e.g., as firmware) that are executable by a processor (e.g., a microcontroller) and/or as logic (e.g., an FPGA).

FIG. 10 illustrates an example of a method 500 for correcting an uncorrected IADC signal output from an interleaved ADC. The method 500 could be implemented, for example by the system 2 of FIG. 1 and/or the system 50 of FIG. 2. At 510, a mismatch estimator (e.g., the mismatch estimator 14 of FIG. 1) can determine a frequency domain mismatch profile, $G_k(m)$ of an uncorrected IADC signal. At 520, a time domain converter (e.g., the time domain converter 16 of FIG. 1) can convert the frequency domain mismatch profile into time domain filter coefficients, $h_i(m)$.

At 530, a mismatch corrector (e.g., the mismatch corrector 18 of FIG. 1) that receives the time domain filter coefficients, $h_i(m)$, can add random noise to the IADC signal to generate a plurality of noisy IADC signals. At 540, the mismatch corrector can quantize the plurality of noisy IADC signals to form a plurality of quantized signals. The number of bits quantized can be based, for example, on a gain of each of a plurality of correction filters that receive the quantized signals and an overall thermal noise of the interleaved ADC. At 550, the mismatch corrector can apply the plurality of correction filters that employ the filter coefficients, $h_i(m)$ on the plurality of quantized signals. At 560, the mismatch corrector can remove the output of the correction filters from the uncorrected IADC signal. At 570, the mismatch corrector can output a corrected IADC signal that has reduced mismatches relative to the uncorrected IADC signal.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A mismatch corrector comprising:
   a correction path comprising a plurality of parallel branches that each comprises a correction filter that applies a respective one of a plurality of time domain filter coefficients that corresponds to a function of a mismatch profile of an interleaved analog-to-digital (IADC) signal on the IADC signal;
   a delay path that delays the IADC signal by a predetermined number of samples to provide a delayed version of the IADC signal; and
   a summer to subtract an output of each correction filter from the delayed version of the IADC signal to generate a corrected IADC signal.

2. The mismatch corrector of claim 1, wherein the mismatch profile characterizes a plurality of spurious signals generated from mismatches in an interleaved analog-to-digital converter (ADC) that generates the IADC signal.

3. The mismatch corrector of claim 1, wherein the corrected IADC signal has a reduced amplitude for each of the spurious signals in the IADC signal.

4. The mismatch corrector of claim 1, wherein the delay path provides the delayed version of the IADC signal to the summer without correction.

5. The mismatch corrector of claim 1, wherein each of the parallel branches of the correction path comprises a switch that receives the output from a corresponding correction filter and the switch closes at predefined intervals, wherein each of the parallel branches outputs a signal to the summer once every predefined interval, wherein the predefined interval is defined by a number of component analog-to-digital converters (ADCs) of an interleaved ADC that provides the IADC signal.

6. The mismatch corrector of claim 1, wherein each of the subset of parallel branches further comprises:
a quantizer that quantizes a signal corresponding to the IADC signal to generate an input for a corresponding correction filter, wherein the quantizing reduces a bit width of the signal corresponding to the IADC signal.

7. The mismatch corrector of claim 6, further comprising:
a noise generator generates random noise that is added into the IADC signal at each of the subset of the plurality of branches to randomize quantization noise.

8. The mismatch corrector of claim 7, wherein the noise generator further comprises:
a linear feedback shift register outputs a stream of numbers; and
a random permute randomizes an order of the stream of numbers to form a plurality of random numbers that are added into the IADC signal.

9. The mismatch corrector of claim 1, wherein each of the correction filters is a real filter.

10. An integrated circuit (IC) chip comprising the mismatch corrector of claim 1.

11. An integrated circuit (IC) chip comprising:
an interleaved analog-to-digital converter (ADC) comprising M number of component ADCs that are each configured to sample an analog signal in response to a clock pulse, wherein M is an integer greater than or equal to two and the interleaved ADC outputs an interleaved ADC (IADC) signal that comprises a plurality of spurious signals formed from mismatches between the M number of component ADCs;
a mismatch estimator determines a frequency domain mismatch profile estimate that characterizes the mismatches between the M number of component ADCs;
a time domain converter to convert the frequency domain mismatch profile estimate into M−1 number of filter coefficients in the time domain; and
a mismatch corrector comprising M−1 number of correction filters to remove the mismatches from a delayed version of the IADC signal based on the M−1 number of filter coefficients to form a corrected IADC signal.

12. The IC chip of claim 11, wherein the time domain converter is configured to:
convert the frequency domain mismatch profile into M number of complex filter functions that characterize the mismatches of the M number of component ADCs; and
transform the M number of complex filter functions into the M−1 number of filter coefficients.

13. The IC chip of claim 11, wherein the time domain converter calculates a correction profile that reduces an error in the corrected IADC output to a predetermined order of magnitude based on the frequency domain mismatch profile.

14. The IC chip of claim 11, wherein the mismatch corrector comprises a delay to provide the delayed version of the IADC signal, wherein the delayed version of the IADC signal is uncorrected.

15. The IC chip of claim 11, wherein the mismatch corrector comprises M−1 number of quantizers to reduce a bit width of a signal input into a corresponding correction filter.

16. The IC chip of claim 15, wherein the mismatch corrector further comprises a noise generator that inserts random noise into the IADC signal to reduce quantization noise.

17. The IC chip of claim 15, wherein the number of bits quantized by each of the M−1 number of quantizers is based on a gain of a corresponding correction filter and a thermal noise of the interleaved ADC.

18. The IC chip of claim 11, wherein the corrected IADC signal reduces an amplitude of the spurious signals present in the IADC signal.

19. A method comprising:
receiving an interleaved analog-to-digital (IADC) signal, the IADC signal comprising a plurality of image signals caused by mismatches in an interleaved analog-to-digital converter (ADC);
receiving a plurality of filter coefficients that correspond to the mismatches in the IADC signal;
applying correction filters to the IADC signal, wherein each correction filter implements one of the plurality of filter coefficients; and
subtracting the output of each of the correction filters from a delayed version of the IADC signal to form a corrected IADC signal.

20. The method of claim 19, wherein an amplitude of image signals in the corrected IADC signal is less than an amplitude of the image signals in the IADC signal.

21. The method of claim 19, further comprising:
quantizing an input of each of the plurality of correction filters to reduce a bit width of the input of each of the plurality of correction filters.

22. The method of claim 21, further comprising:
inserting random noise into the IADC signal to reduce quantization noise caused by the quantizing.

* * * * *